United States Patent
Yook et al.

(10) Patent No.: US 12,469,944 B2
(45) Date of Patent: Nov. 11, 2025

(54) WAVEGUIDE PACKAGE, METHOD OF MANUFACTURING THE SAME, AND PACKAGE HOUSING

(71) Applicant: KOREA ELECTRONICS TECHNOLOGY INSTITUTE, Seongnam-si (KR)

(72) Inventors: Jong Min Yook, Seongnam-si (KR); Je In Yu, Seoul (KR); Dong Su Kim, Seongnam-si (KR)

(73) Assignee: Korea Electronics Technology Institute, Seongnam-si (KR)

( * ) Notice: Subject to any disclaimer, the term of this patent is extended or adjusted under 35 U.S.C. 154(b) by 463 days.

(21) Appl. No.: 18/053,222

(22) Filed: Nov. 7, 2022

(65) Prior Publication Data

US 2023/0145380 A1 May 11, 2023

(30) Foreign Application Priority Data

Nov. 9, 2021 (KR) .................. 10-2021-0153211

(51) Int. Cl.
*H01P 3/12* (2006.01)
*H01L 21/48* (2006.01)
(Continued)

(52) U.S. Cl.
CPC ............ *H01P 3/121* (2013.01); *H01L 21/486* (2013.01); *H01L 23/043* (2013.01); *H01L 23/49827* (2013.01); *H01P 11/002* (2013.01)

(58) Field of Classification Search
CPC . H01L 21/561; H01L 23/66; H01L 23/49838; H01L 23/49827; H01L 21/481;
(Continued)

(56) References Cited

U.S. PATENT DOCUMENTS

2012/0013499 A1* 1/2012 Hayata ............. H01L 23/49805
  342/112
2017/0207510 A1* 7/2017 Park ....................... H01P 3/122
(Continued)

FOREIGN PATENT DOCUMENTS

JP        2000-058691 A      2/2000
KR   10-2004-0056645         7/2004
(Continued)

OTHER PUBLICATIONS

Office Action received in Korean Application No. 10-2021-0153211 dated Sep. 24, 2024.
(Continued)

*Primary Examiner* — Quan Tra
(74) *Attorney, Agent, or Firm* — Knobbe Martens Olson & Bear LLP

(57) ABSTRACT

A waveguide package and a method for manufacturing the same are disclosed. The waveguide package includes a package structure including a waveguide opened toward one side surface of a substrate, a semiconductor chip mounted on one surface of the package structure and configured to output an electrical signal to the waveguide. Since an interior of the waveguide is filled with air, electrical loss of the waveguide is minimized. The cavity is formed by processing the substrate made of photosensitive glass. Accordingly, the waveguide may be accurately formed. An electronic circuit may also be formed at the waveguide package. Accordingly, it may be possible to provide a waveguide package enhanced in degree of integration.

13 Claims, 10 Drawing Sheets

(51) Int. Cl.
  *H01L 23/043*  (2006.01)
  *H01L 23/498*  (2006.01)
  *H01P 11/00*  (2006.01)
(58) Field of Classification Search
  CPC ............... H01L 21/486; H01L 23/043; H01L 2223/6677; H01L 2223/6616; H01P 5/107; H01P 11/002; H01P 3/121
  See application file for complete search history.

(56) References Cited

U.S. PATENT DOCUMENTS

| | | | | |
|---|---|---|---|---|
| 2018/0183127 | A1* | 6/2018 | Huang | H01P 3/121 |
| 2018/0310399 | A1* | 10/2018 | Nair | H01P 3/121 |
| 2020/0153108 | A1* | 5/2020 | Uemichi | H01Q 13/106 |
| 2020/0294939 | A1* | 9/2020 | Aleksov | H01L 23/49838 |
| 2020/0294940 | A1* | 9/2020 | Dogiamis | H01P 11/001 |
| 2020/0315052 | A1* | 10/2020 | Kamgaing | H01L 25/0655 |

FOREIGN PATENT DOCUMENTS

| | | |
|---|---|---|
| KR | 10-2021-0002036 A | 1/2021 |
| KR | 10-2228555 B1 | 3/2021 |

OTHER PUBLICATIONS

Office Action dated Nov. 10, 2023 in Korean Application No. 10-2021-0153211.

* cited by examiner

WAVEGUIDE PACKAGE, METHOD OF MANUFACTURING THE SAME, AND PACKAGE HOUSING

BACKGROUND OF THE INVENTION

Field of the Invention

The present invention relates to a waveguide package, a method of manufacturing the same, and a package housing.

Description of the Related Art

Recently, a high-frequency signal of a millimeter-wave band has been usable in accordance with advances in communication technology. A conventional transmission line used for transmission of an electrical signal of a low frequency band is not suitable for transmission of an electrical signal of a high frequency band because the transmission line exhibits high loss characteristics in a millimeter-wave band. A waveguide is used in order to transmit a signal of a millimeter-wave band at low loss. A general waveguide is processed using a metal. In this case, there is a problem of a large volume. Furthermore, a lot of time is taken in precise processing for high-frequency waves. Surface integrated waveguide (SIW) technology using a plurality of vias has been developed, as disclosed in the following patent document. Structures for coupling a semiconductor chip and a waveguide have also been developed.

RELATED ART LITERATURE

Patent Documents

Patent Document 1: KR 10-2228555 B1

SUMMARY OF THE INVENTION

Technical Problem

Therefore, the present invention has been made in view of the above problems, and it is an object of the present invention to provide a waveguide package in which a waveguide filled with air is formed using a photosensitive glass substrate, a semiconductor chip is mounted on the substrate, and formation of a circuit on the substrate is possible, and a method for manufacturing the same.

It is another object of the present invention to provide a package housing in which a waveguide package is mounted, thereby enabling extension of a waveguide.

Problem Solving Means

In accordance with an aspect of the present invention, the above and other objects can be accomplished by the provision of a waveguide package including a package structure including a waveguide opened toward one side surface of a substrate, and a semiconductor chip mounted on one surface of the package structure and configured to output an electrical signal to the waveguide.

The waveguide may include a cavity extending through the one surface of the substrate and another surface of the substrate opposite to the one surface while being opened to the one side surface of the substrate, an inner metal layer formed at an inner surface of the cavity, an upper metal layer formed at the one surface of the substrate, to cover a side of one surface of the cavity, and a lower metal layer formed at the other surface of the substrate, to cover a side of another surface of the cavity.

The waveguide may include a cavity extending through the one surface of the substrate and another surface of the substrate opposite to the one surface while being opened to the one side surface of the substrate, an inner metal layer formed at an inner surface of the cavity, an upper metal layer formed at the one surface of the substrate, to cover a side of one surface of the cavity, a lower metal layer formed at the other surface of the substrate, to cover a side of another surface of the cavity, an upper insulating layer formed between the inner metal layer and the upper metal layer, to support the upper metal layer, a lower insulating layer formed between the inner metal layer and the lower metal layer, to support the lower metal layer, an upper connection via formed to extend through the upper insulating layer and the upper metal layer and configured to interconnect the upper metal layer and the inner metal layer, and a lower connection via formed to extend through the lower insulating layer and the lower metal layer and configured to interconnect the lower metal layer and the inner metal layer.

The upper connection via and the lower connection via may be formed in plural. The plurality of upper connection vias may be disposed along a circumference of the cavity to be spaced apart from one another by a predetermined distance. The plurality of lower connection vias may be disposed along the circumference of the cavity to be spaced apart from one another by a predetermined distance.

The waveguide may include a cavity extending through the one surface of the substrate and another surface of the substrate opposite to the one surface while being opened to the one side surface of the substrate, an inner metal layer formed at an inner surface of the cavity, a first upper metal layer formed at the one surface of the substrate, to cover a side of one surface of the cavity, a first lower metal layer formed at the other surface of the substrate, to cover a side of another surface of the cavity, an upper insulating layer formed between the inner metal layer and the first upper metal layer, to support the first upper metal layer, a lower insulating layer formed between the inner metal layer and the first lower metal layer, to support the first lower metal layer, a plurality of upper through holes formed to extend through the upper insulating layer and the first upper metal layer and to be spaced apart from one another by a predetermined distance along a circumference of the cavity, a plurality of lower through holes formed to extend through the lower insulating layer and the first lower metal layer and to be spaced apart from one another by a predetermined distance along the circumference of the cavity, a second upper metal layer formed at the first upper metal layer, to be connected to the inner metal layer via the upper through holes, and a second lower metal layer formed at the first lower metal layer, to be connected to the inner metal layer via the lower through holes.

The package structure may further include a through glass via extending through the one surface and another surface of the substrate, to provide an electrical ground or to dissipate heat generated from the semiconductor chip.

The package structure may further include an electronic circuit formed at the one surface of the substrate and connected to the semiconductor chip.

The waveguide may include a cavity formed to have a "Y"-shape, so as to function as a distributor or a coupler, or may include a cavity formed with a slot without being opened to one side surface of the substrate, so as to function as a slot antenna.

In accordance with a further aspect of the present invention, there is provided a package housing including a lower housing including a package receiving portion formed at one surface of the lower housing and configured to receive the waveguide package, and a waveguide extension portion extending from the package receiving portion while being connected to the waveguide, and an upper housing including a cap portion formed at one surface of the upper housing and configured to receive the semiconductor chip, the upper housing being coupled to the lower housing such that the cap portion faces the package receiving portion, wherein the upper housing and the lower housing are formed of an electrically conductive material.

In accordance with a further aspect of the present invention, there is provided a method of manufacturing a waveguide package, the method including a substrate processing step of forming a cavity extending through one surface and another surface of a substrate while having a center at a package boundary, a metal layer forming step of forming an inner metal layer at an inner surface of the cavity, and forming, at the one surface and the other surface of the substrate, metal layers connected to the inner metal layer while covering one surface and another surface of the cavity, respectively, a cutting step of cutting a resultant structure along the package boundary, thereby forming a package structure including a waveguide opened to one side surface of the substrate, and a mounting step of mounting a semiconductor chip on the one surface of the substrate.

The metal layer forming step may include a coating step of forming an inner metal layer at a surface of the substrate, a film forming step of performing lamination coating at the one surface of the substrate using a film including an upper insulating layer and a first upper metal layer, to cover the inner metal layer and the cavity, and performing lamination coating at the other surface of the substrate using a film including a lower insulating layer and a first lower metal layer, to cover the inner metal layer and the cavity, a film punching step of forming, along a circumference of the cavity, a plurality of upper through holes extending through the upper insulating layer and the first upper metal layer, thereby exposing the inner metal layer formed at the one surface of the substrate, and forming, along the circumference of the cavity, a plurality of lower through holes extending through the lower insulating layer and the first lower metal layer, thereby exposing the inner metal layer formed at the other surface of the substrate, and a connection via forming step of forming a second upper metal layer on the first upper metal layer, thereby forming an upper connection via interconnecting the inner metal layer, the first upper metal layer, and the second upper metal layer via each of the upper through holes, and forming a second lower metal layer on the first lower metal layer, thereby forming a lower connection via interconnecting the inner metal layer, the first lower metal layer, and the second lower metal layer via each of the lower through holes.

The substrate processing step may further form a substrate through hole extending through the one surface and the other surface of the substrate. The coating step may form the inner metal layer at the one surface and the other surface of the substrate, the inner surface of the cavity, and an inner surface of the substrate through hole.

The connection via forming step may further form an electronic circuit by patterning the first upper metal layer and the second upper metal layer.

The connection via forming step may further form a signal transition member by patterning the first upper insulating layer, the first upper metal layer, and the second upper metal layer on the cavity. The mounting step may dispose the semiconductor chip to be adjacent to the cavity, and may then interconnect the signal transition member and a chip pad of the semiconductor chip through wire bonding.

Prior to the description, it should be understood that the terms used in the specification and appended claims should not be construed as limited to general and dictionary meanings, but interpreted based on the meanings and concepts corresponding to technical aspects of the present invention on the basis of the principle that the inventor is allowed to define terms appropriately for best explanation.

Effect of the Invention

As apparent from the above description, in accordance with the exemplary embodiments of the present invention, a photosensitive glass substrate is used and, as such, a waveguide structure using a plurality of vias may be accurately manufactured.

In addition, in accordance with the exemplary embodiments of the present invention, the interior of the waveguide is filled with air and, as such, it may be possible to minimize loss of an electrical signal, as compared to a structure in which an interior of a waveguide is filled with a dielectric material exhibiting relatively high electrical signal loss.

In addition, in accordance with the exemplary embodiments of the present invention, a waveguide, a semiconductor chip, and an electronic circuit may be integrally formed at a package.

Furthermore, in accordance with the exemplary embodiments of the present invention, a waveguide package may be mounted in a package housing and, as such, it may be possible to transmit a high frequency signal through a waveguide extension portion formed at the package housing.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

Figure 1:
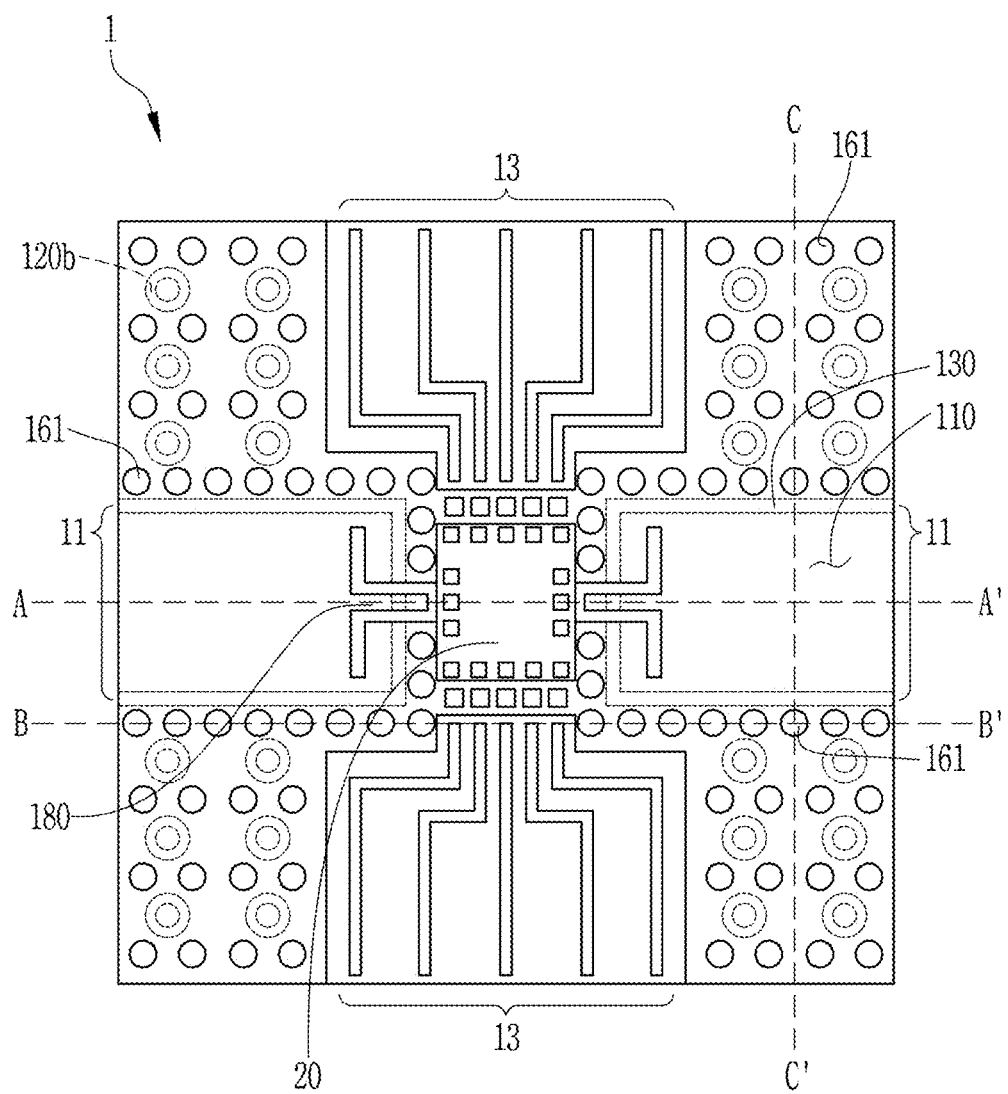
FIG. 1 is a plan view showing a waveguide package according to an exemplary embodiment of the present invention.

Objects, particular advantages and new features of the present invention will be more clearly understood from the following detailed description and preferred embodiments taken in conjunction with the accompanying drawings. In the specification, in adding reference numerals for elements in each drawing, it should be noted that like reference numerals already used to denote like elements in other drawings are used for elements wherever possible. In addition, the terms "one surface", "the other surface", "first" and "second" are used to differentiate one constituent element from the other constituent element, and these constituent elements should not be limited by these terms. In the following description, when the detailed description of the relevant known function or configuration is determined to unnecessarily obscure the subject matter of the present invention, such detailed description will be omitted.

Meanwhile, it should be understood that, when terms representing directions such as upwards, downwards, left, right, an X-axis, a Y-axis, Z-axis, etc. are used in the specification, these terms are merely for convenience of description, and such directions may be expressed differently from those represented by the terms, in accordance with the viewing position of an observer or the position at which an object is disposed.

It should be noted that terms used herein are merely used to describe a specific embodiment, not to limit the present invention. Incidentally, unless clearly used otherwise, singular expressions include a plural meaning.

Hereinafter, exemplary embodiments of the present invention will be described in detail with reference to the accompanying drawings.

Figure 2:
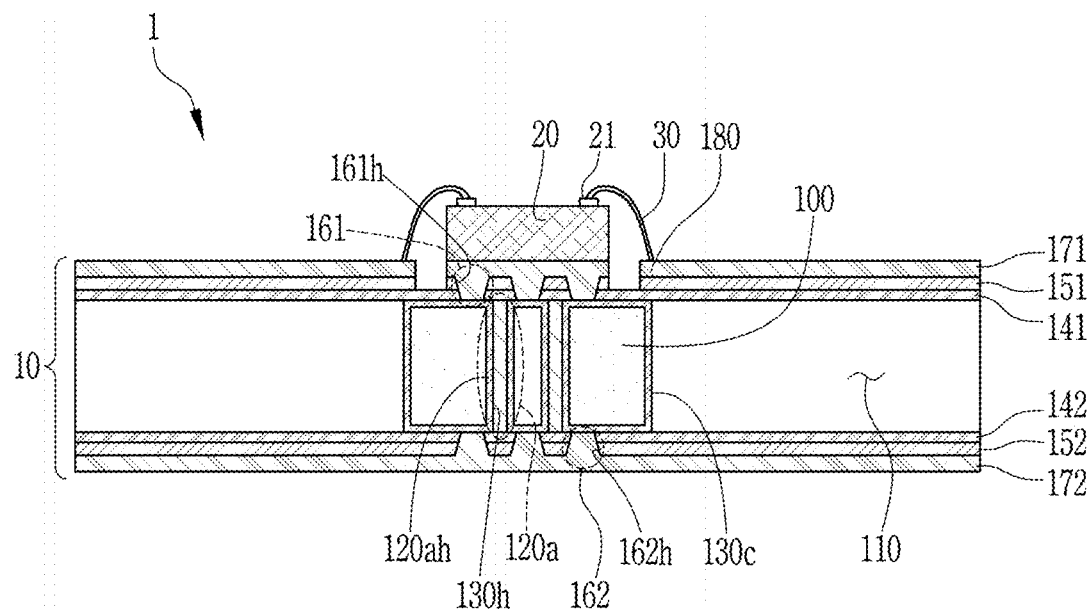
FIG. 2 is a cross-sectional view taken along line A-A' in FIG. 1.
Figure 3:
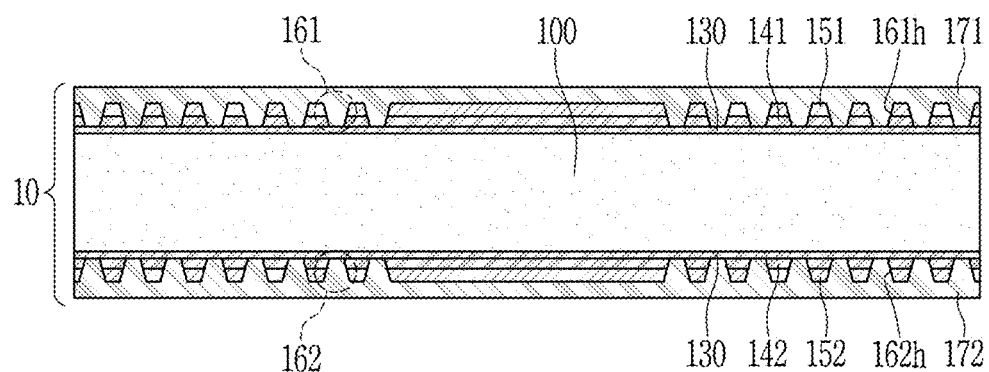
FIG. 3 is a cross-sectional view taken along line B-B' in FIG. 1.
Figure 4:
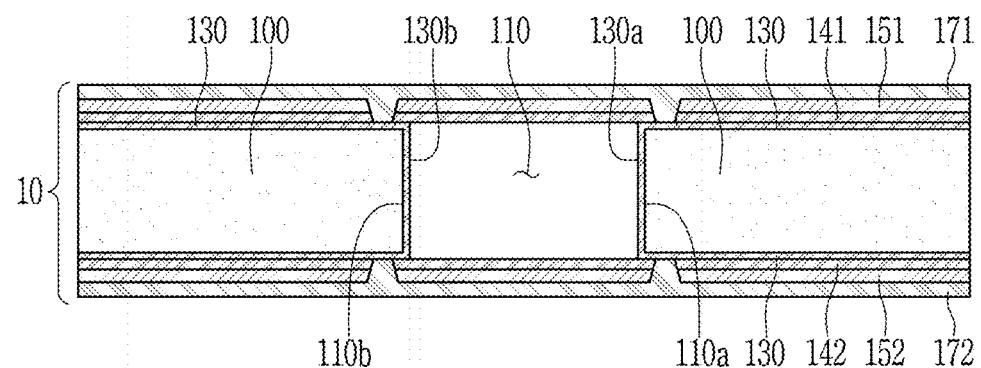
FIG. 4 is a cross-sectional view taken along line C-C' in FIG. 1.

FIG. 1 is a plan view showing a waveguide package 1 according to an exemplary embodiment of the present invention. FIG. 2 is a cross-sectional view taken along line A-A' in FIG. 1. FIG. 3 is a cross-sectional view taken along line B-B' in FIG. 1. FIG. 4 is a cross-sectional view taken along line C-C' in FIG. 1. The following description will be given with reference to FIGS. 1 to 4.

The waveguide package 1 according to the exemplary embodiment of the present invention may include a package structure 10 including a waveguide 11 opened toward one side surface of a substrate 100, and a semiconductor chip 20 mounted on one surface of the package structure 10 and configured to output an electrical signal to the waveguide 11.

The waveguide package 1 may be completed by manufacturing the package structure 10, and then mounting the semiconductor chip 20 on the package structure 10. The package structure 10 may be manufactured through a process separate from that of the semiconductor chip 20. The package structure 10 itself may be commercially available as one product. The waveguide 11 included in the package structure 10 is connected to the semiconductor chip 20 and, as such, may transmit and receive a high-frequency electrical signal.

The semiconductor chip 20 may have an active surface formed with a chip pad 21 at one surface thereof, and an inactive surface opposite to the active surface. The semiconductor chip 20 may include an RFIC using an electrical signal of a high frequency band. The semiconductor chip 20 may operate in a millimeter-wave band or a higher frequency band. The semiconductor chip 20 may be mounted on a central portion of one surface of the package structure 10. The package structure 10 may be configured such that one or more semiconductor chips are mounted thereon.

The waveguide 11 may be formed in a number of one or more at the package structure 10. The waveguide 11 may be formed to have a structure opened to one side surface of the package structure 10. That is, the waveguide 11 may transmit or receive an electrical signal to or from the side surface of the package structure 10. An interior of the waveguide 11 may include air without being filled with a dielectric material. Since the waveguide 11 according to the exemplary embodiment of the present invention includes air therein, the waveguide 11 exhibits excellent signal transmission characteristics, as compared to a conventional waveguide filled with a dielectric material. For example, a waveguide of a postwall type, in which a plurality of conductive vias is formed at a silicon substrate, exhibits great electrical loss because an interior of the waveguide is filled with silicon. On the other hand, the waveguide according to the exemplary embodiment of the present invention exhibits very small electrical loss because the interior of the waveguide is filled with air.

The waveguide 11 may interconnect a plurality of semiconductor chips 20 mounted on the package structure 10 without being opened to one side surface of the package structure 10. For example, a first semiconductor chip may be connected to one end of the waveguide 11, and a second semiconductor chip may be connected to the other end of the waveguide 11.

The waveguide 11 may include a cavity 110 extending through the one surface of the substrate 100 and the other surface of the substrate 100 opposite to the one surface while being opened to the one side surface of the substrate 100, an inner metal layer 130 formed at an inner surface of the cavity 110, an upper metal layer formed at the one surface of the substrate, to cover a side of one surface of the cavity 110, and a lower metal layer formed at the other surface of the substrate 100, to cover a side of the other surface of the cavity 110. That is, metal layers formed at upper, lower, left and right sides with reference to the air cavity 110 form the waveguide 11.

The substrate 100 has one surface, the other surface opposite to the one surface, and side surfaces interconnecting the one surface and the other surface. The one surface of the substrate 100 is shown as facing upward. The substrate 100 may be formed of photosensitive glass. When photosensitive glass is subjected to exposure, heating, and etching processes, a structure having high accuracy may be manufactured. Accordingly, the cavity 110 may be formed at high accuracy. The substrate 100 may be formed of silicon. Of course, the substrate 100 may preferably be formed of photosensitive glass in order to form a structure of the cavity 100 at high accuracy. In the specification, an embodiment using a substrate formed of photosensitive glass will be described.

The cavity 110 may be formed to extend through the one surface and the other surface of the substrate 100. The cavity 100 may be formed to be opened to one side surface of the substrate 100. That is, the cavity 110 may be formed along the one surface, the other surface, and the side surface of the substrate 100. In other words, the cavity 110 is a space formed to be concave toward an inside of the substrate 100 while extending from the side surface of the substrate 100. The cavity 110 may have a first inner surface 110a, a second inner surface 110b, and a third inner surface 110c. The inner surfaces of the cavity 110 are a part of side surfaces of the substrate 100. The first inner surface 110a and the second inner surface 110b of the cavity 110 are formed to face each other while extending from the side surface of the substrate 100 toward the inside of the substrate 100. The third inner surface 110c of the cavity 110 may be formed to be perpendicular to the first inner surface 110a and the second inner surface 110b while being parallel to the side surface of the substrate 100. That is, the cavity 110 may be formed to have a hexahedral shape in the entirety thereof. When the cavity 110 having the hexahedral shape in the entirety thereof is surrounded by a metal layer, the waveguide 11, which has a quadrilateral pipe shape in the entirety thereof, may be formed. Of course, the shape of the cavity 110 according to the exemplary embodiment of the present invention may be variously designed taking into consideration the frequency, amplitude, and other characteristics of an electrical signal to be transmitted.

The inner metal layer 130, the upper metal layer (a first upper metal layer 151 and a second upper metal layer 171), and the lower metal layer (a first lower metal layer 152 and a second metal layer 172) may cover the one surface, the other surface, the first inner surface 110a, the second inner surface 110b, and the third inner surface 110c of the cavity 110. The inner metal layer 130, the upper metal layer, and the lower metal layer do not cover a portion of the cavity 110 opened to the side surface of the substrate 100. As the inner metal layer 130, the upper metal layer, and the lower metal layer open one surface of the cavity 110 having the hexahedral shape in the entirety thereof while covering five surfaces of the cavity 110, the waveguide 11 may be formed.

The inner metal layer 130, the upper metal layer, and the lower metal layer may be formed of a metal having electrical conductivity. The inner metal layer 130 may include copper (Cu), aluminum (Al), silver (Ag), other metals, alloys thereof, etc.

The inner metal layer 130 may be formed at the inner surface of the cavity 110. The inner metal layer 130 may be formed at a surface of the substrate 100. The surface of the substrate 100 may include one surface, the other surface, and side surfaces of the substrate 100. The inner metal layer 130 may be formed at the inner surface of the cavity 110, the one surface of the substrate 100, and the other surface of the substrate 100. The inner metal layer 130 may include a first surface 130a, a second surface 130b, and a third surface 130c. The first surface 130a of the inner metal layer 130 is formed on the first inner surface 110a of the cavity 110. The second surface 130b of the inner metal layer 130 is formed on the second inner surface 110b of the cavity 110. The third surface 130c of the inner metal layer 130 is formed on the third inner surface 110c of the cavity 110.

The upper metal layer may be formed on the one surface of the substrate 100. The lower metal layer may be formed on the other surface of the substrate 100. The upper metal layer may be connected to the inner metal layer 130. The lower metal layer may be connected to the inner metal layer 130. A portion of the cavity 110 facing the one surface of the substrate 110 may be covered by the upper metal layer. A portion of the cavity 110 facing the other surface of the substrate 110 may be covered by the lower metal layer.

As the upper metal layer covering the portion of the cavity 110 facing the one surface of the substrate 110, the lower metal layer covering the portion of the cavity 110 facing the other surface of the substrate 110, the first surface 130a of the inner metal layer 130 covering the first inner surface 110a of the cavity 110, the second surface 130b of the inner metal layer 130 covering the second inner surface 110b of the cavity 110, and the third surface 130c of the inner metal layer 130 covering the third inner surface 110c of the cavity 110 are interconnected, the waveguide 11 may be formed.

The package structure 10 may further include a through glass via 120 extending through the one surface and the other surface of the substrate 100, to provide an electrical ground or to dissipate heat generated from the semiconductor chip 20. The through glass via 120 may be formed to extend through the one surface and the other surface of the substrate 100. The through glass via 120 may include a substrate through hole 120h extending through the one surface and the other surface of the substrate 100, and a hole part 130h of the inner metal layer 130 formed at an inner surface of the substrate through hole 120h.

The through glass via 120 may include a first through glass via 120a formed at a position of the package structure 10 where the semiconductor chip 20 is mounted, and a second through glass via 120b formed in a region where the first through glass via 120a, the waveguide 11, and an electronic circuit 13 are not formed. The first through glass via 120a may transfer heat generated by the semiconductor chip 20 to the other surface of the substrate 100. The second through glass via 120b may interconnect inner metal layers 130 respectively formed at the one surface and the other surface of the substrate 100, thereby providing an electrical ground. The through glass via 120 may be formed in plural.

The second through glass via 120b may be formed to be electrically isolated from the inner metal layer 130. For example, an inner metal layer 130 may be formed at a surface of the substrate 100, another inner metal layer 130 may be formed at an inner surface of the substrate through hole 120h, and a portion of the inner metal layer 130 around the second through glass via 120b may then be removed. The second through glass via 120b formed using the above-described method may be used as a path for transmitting an electrical signal because the second through glass via 120b is electrically isolated from the inner metal layer 130b. When the second through glass via 120b insulated from the inner metal layer 130 is used, an input/output pad may be formed at the other surface of the package structure 10. That is, the other surface of the package structure 10 may be connected to an external circuit.

The package structure 10 may further include the electronic circuit 13 which is formed at the one surface of the substrate 100 and connected to the semiconductor chip 20. The electronic circuit 13 may include a passive element such as a resistor, a capacitor, an inductor, etc., an electrode pattern configured to transmit an electrical signal, etc. The electronic circuit 13 may include a microstrip, a coplanar waveguide (CPW), and a transmission line having various structures. The electronic circuit 13 may be formed by patterning a portion of the upper metal layer or using an additional thin film formation process. The electronic circuit 13 may be connected to the semiconductor chip 20. The semiconductor chip 20 and the electronic circuit 13 may be interconnected by a wire (not shown) through wire bonding. The electronic circuit 13 may be formed in a region where the waveguide 11 of the package structure 10 is not formed.

Conventionally, an electronic circuit required for a waveguide formed of a metal is constituted by a separate substrate. In accordance with the exemplary embodiment of the present invention, however, the electronic circuit 13 is formed to be integrated in the package structure 10 and, as such, the degree of integration may be enhanced.

Hereinafter, structures of the inner metal layer 130, the upper metal layer, and the lower metal layer constituting the waveguide 11 will be described in detail.

The waveguide 11 may include the cavity 110, the inner metal layer 130, the upper metal layer, the lower metal layer, an upper insulating layer 141 formed between the inner metal layer 130 and the upper metal layer, to support the upper metal layer, a lower insulating layer 142 formed between the inner metal layer 130 and the lower metal layer, to support the lower metal layer, an upper connection via 161 formed to extend through the upper insulating layer 141 and the upper metal layer and configured to interconnect the upper metal layer and the inner metal layer 130, and a lower connection via 162 formed to extend through the lower insulating layer 142 and the lower metal layer and configured to interconnect the lower metal layer and the inner metal layer 130. In this case, the upper connection via 161 and the lower connection via 162 may be formed in plural. In this case, the plurality of upper connection vias 161 may be disposed along a circumference of the cavity 110 to be spaced apart from one another by a predetermined distance, and the plurality of lower connection vias 162 may be disposed along the circumference of the cavity 110 to be spaced apart from one another by a predetermined distance.

It is difficult to form the upper metal layer and the lower metal layer such that the upper metal layer and the lower metal layer cover one surface of the cavity 110, using a general plating process. The cavity 110 is an empty space where the substrate 100 is not present and, as such, the upper metal layer or the lower metal layer is not supported in a plating process or the like. In accordance with the exemplary embodiment of the present invention, the upper insulating layer 141 is formed between the inner metal layer 130 and the upper metal layer, and the lower insulating layer 142 is formed between the inner metal layer 130 and the lower metal layer. The upper insulating layer 141 and the lower insulating layer 142 are formed using a film or the like and, as such, may be coupled to the inner metal layer 130. The upper insulating layer 141 may cover a portion of the cavity 110 facing one surface of the substrate 100, and may support the upper metal layer. The lower insulating layer 142 may cover a portion of the cavity 110 facing the other surface of the substrate 100, and may support the lower metal layer.

When the inner metal layer 130, the upper insulating layer 141, and the upper metal layer are sequentially formed in this order, the inner metal layer 130 and the upper metal layer are insulated from each other by the upper insulating layer 141. For formation of the waveguide 11, the inner metal layer 130 and the upper metal layer should be interconnected. The upper connection via 161 is formed to extend through the upper insulating layer 141. The upper connection via 161 interconnects the inner metal layer 130 and the upper metal layer. The upper connection via 161 may be formed in plural along the circumference of the cavity 110. The plurality of upper connection vias 161 may be formed to be spaced apart from one another by a predetermined distance. The distance among the upper connection vias 161 may be determined in accordance with the frequency of an electrical signal transmitted by the waveguide 11.

When the inner metal layer 130, the lower insulating layer 142, and the lower metal layer are sequentially formed in this order, the inner metal layer 130 and the lower metal layer are insulated from each other by the lower insulating layer 142. For formation of the waveguide 11, the inner metal layer 130 and the lower metal layer should be interconnected. The lower connection via 162 is formed to extend through the lower insulating layer 142. The lower connection via 162 interconnects the inner metal layer 130 and the lower metal layer. The lower connection via 162 may be formed in plural along the circumference of the cavity 110. The plurality of lower connection vias 162 may be formed to be spaced apart from one another by a predetermined distance. The distance among the lower connection vias 162 may be determined in accordance with the frequency of the electrical signal transmitted by the waveguide 11.

The waveguide 11 may be formed by the first surface 130a, the second surface 130b, and the third surface 130c of the inner metal layer 130, the upper metal layer connected to the inner metal layer 130 by the upper connection via 161, and the lower metal layer connected to the inner metal layer 130 by the lower connection via 162. Since the cavity 110 is an empty space, the upper insulating layer 141 and the lower insulating layer 142 are required in order to support the upper metal layer and the lower metal layer. In addition, for connection between the upper metal layer and the inner metal layer 130, the upper connection via 161 extending through the upper insulating layer 141 is formed, and, for connection between the lower metal layer and the inner metal layer 130, the lower connection via 162 extending through the lower insulating layer 142 is formed.

Hereinafter, structures of the inner metal layer 130, the upper metal layer, and the lower metal layer constituting the waveguide 11 will be described in more detail.

The waveguide 11 may include the cavity 110, the inner metal layer 130, the first upper metal layer 151 formed at the one surface of the substrate 100, to cover a side of one surface of the cavity 110, the first lower metal layer 152 formed at the other surface of the substrate 110, to cover a side of the other surface of the cavity 110, the upper insulating layer 141 formed between the inner metal layer 130 and the first upper metal layer 151, to support the first upper metal layer 151, the lower insulating layer 142 formed between the inner metal layer 130 and the first lower metal layer 152, to support the first lower metal layer 152, a plurality of upper through holes 161h formed to extend through the upper insulating layer 141 and the first upper metal layer 151 and to be spaced apart from one another by a predetermined distance along the circumference of the cavity 110, a plurality of lower through holes 162h formed to extend through the lower insulating layer 142 and the first lower metal layer 152 and to be spaced apart from one another by a predetermined distance along the circumference of the cavity 110, the second upper metal layer 171 formed at the first upper metal layer 151, to be connected to the inner metal layer 130 via the upper through holes 161h, and the second lower metal layer 172 formed at the first lower metal layer 152, to be connected to the inner metal layer 130 via the lower through holes 162h.

The upper metal layer may include the first upper metal layer 151 and the second metal layer 171. The lower metal layer may include the first lower metal layer 152 and the second lower metal layer 172. The second upper metal layer 171 may be formed on the first upper metal layer 151. The second lower metal layer 172 may be formed on the first lower metal layer 152.

Formation of the first upper metal layer 151 on the upper insulating layer 141 may be difficult in terms of process. In accordance with an embodiment of the present invention, the upper insulating layer 141 and the first upper metal layer 151 may be formed on the upper metal layer 130 at once through a method in which a film with the upper insulating layer 141 and the first upper metal layer 151 coupled thereto is coupled to the one surface of the substrate 100. Similarly, the lower insulating layer 142 and the first lower metal layer 152 may be formed on the lower metal layer 130 at once through a method in which a film with the lower insulating layer 142 and the first lower metal layer 152 coupled thereto is coupled to the other surface of the substrate 100.

When a film integrally formed with an insulating layer and a metal layer is used, it is necessary to connect the metal layer to the inner metal layer 130. Each upper through hole 161h extends through the upper insulating layer 141 and the first upper metal layer 151 and, as such, exposes the inner metal layer 130. The second upper metal layer 171, which is formed on the first upper metal layer 151, is connected to the inner metal layer 130 via the upper through hole 161h. In this case, the upper through hole 161h and a portion of the second upper metal layer 171 filling the upper through hole 161h form the upper connection via 161. Since the second upper metal layer 171 is formed on the first upper metal layer 151, the first upper metal layer 151 and the second upper metal layer 171 are connected to the inner metal layer 130 via the upper connection via 161.

Each lower through hole 162h extends through the lower insulating layer 142 and the first lower metal layer 152 and, as such, exposes the inner metal layer 130. The second lower metal layer 172, which is formed on the first lower metal layer 152, is connected to the inner metal layer 130 via the lower through hole 162h. In this case, the lower through hole 162h and a portion of the second lower metal layer 172 filling the lower through hole 162h form the lower connection via 162. Since the second lower metal layer 172 is formed on the first lower metal layer 152, the first lower metal layer 152 and the second lower metal layer 172 are connected to the inner metal layer 130 via the lower connection via 162.

The waveguide 11 may be formed by the first surface 130a, the second surface 130b, and the third surface 130c of the inner metal layer 130, the first and second upper metal layers 151 and 171 connected to the inner metal layer 130 by the upper connection via 161, and the first and second lower metal layers 152 and 172 connected to the inner metal layer 130 by the lower connection via 162. The waveguide 11 may be formed by coupling a film integrally formed with an insulating layer and a metal layer to the inner metal layer 130 in order to form a metal layer covering the cavity 110, which is an empty space, forming the upper through hole 161h and the lower through hole 162h, and then forming the second upper metal layer 171 and the second lower metal layer 172.

The upper connection via 161 and the lower connection via 162 may also be formed in a region where the waveguide 11 and the electronic circuit 13 are not formed. The upper connection via 161 may interconnect the upper metal layer and the inner metal layer 130, and the lower connection via 162 may interconnect the lower metal layer and the inner metal layer 130. The through glass via 120 may be connected to the upper connection via 161 or the lower connection via 162 and, as such, may transmit an electrical signal or a ground signal.

The inner metal layer 130, the upper metal layer, and the lower metal layer may form a transmission line having various structures using patterning. A part of the electronic circuit 13 may be formed by patterning the inner metal layer 130, the upper metal layer, and the lower metal layer.

An electrical signal output from the semiconductor chip 20 may be transmitted to the waveguide 11 via a signal transition member 180 formed at one end of the waveguide 11. The signal transition member 180 may change a transmission mode of the electrical signal. The signal transition member 180 may be formed at a central portion of the waveguide 11 in a width direction. The width of the waveguide 11 may be a distance between the first surface 130a and the second surface 130b of the inner metal layer 130. The signal transition member 180 may be disposed outside the waveguide 11 at one end thereof with reference to the third surface 130c of the inner metal layer 130 while being disposed inside the waveguide 11 at the other end thereof. The signal transition member 180 may be formed by patterning the first upper metal layer 151 and the second upper metal layer 171. The signal transition member 180 may have a "⊥"-shape, and may be formed by removing portions of the first upper metal layer 151 and the second upper metal layer 171. The signal transition member 180 may be formed to have various shapes in accordance with characteristics of the electrical signal and characteristics of the waveguide 11. The chip pad of the semiconductor chip 20 and the signal transition member 180 may be interconnected by a wire 30 through wire bonding. In this case, a total of three wires 30 including an intermediate wire for transmission of a signal and opposite wires for transmission of a ground signal may be connected.

Figure 5:
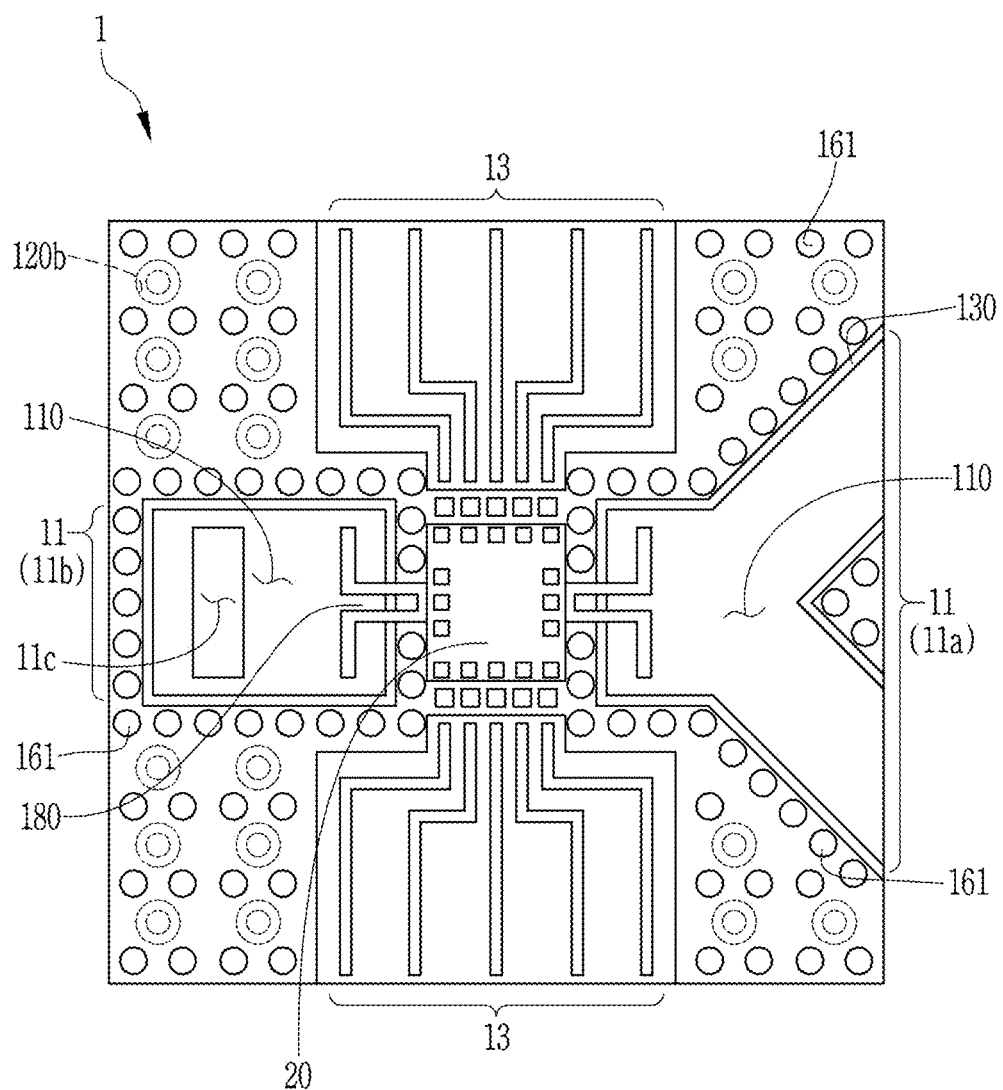
FIG. 5 is a plan view showing a structure in which a waveguide functions as a distributor and a slot antenna in accordance with an exemplary embodiment of the present invention.

FIG. 5 is a plan view showing a structure in which the waveguide 11 functions as a distributor 11a and a slot antenna 11b in accordance with an exemplary embodiment of the present invention.

The waveguide 11 according to the exemplary embodiment of the present invention may be formed to have a structure performing functions of the distributor 11a, a coupler, the slot antenna 11b, etc. When the cavity 110 of the waveguide 11 is formed to have a "Y"-shape, the waveguide 11 may function as the distributor 11a or the coupler. When the cavity 110 is formed with a slot 11c without being opened to one side surface of the substrate 100, the waveguide 11 may function as the slot antenna 11b. The slot 11c may be formed by removing portions of the upper insulating layer 141, the first upper metal layer 151, and the second upper metal layer 171.

A left waveguide 11 shown in FIG. 5 is formed to perform a function of the slot antenna 11b, and a right waveguide 11 shown in FIG. 5 is formed to perform a function of the distributor 11a. Although not shown in FIG. 5, a waveguide 11 may be formed to have a "Y"-shape to perform a function of a coupler in order to couple electrical signals output from two semiconductor chips 20 mounted in one waveguide package 1.

Figure 6:
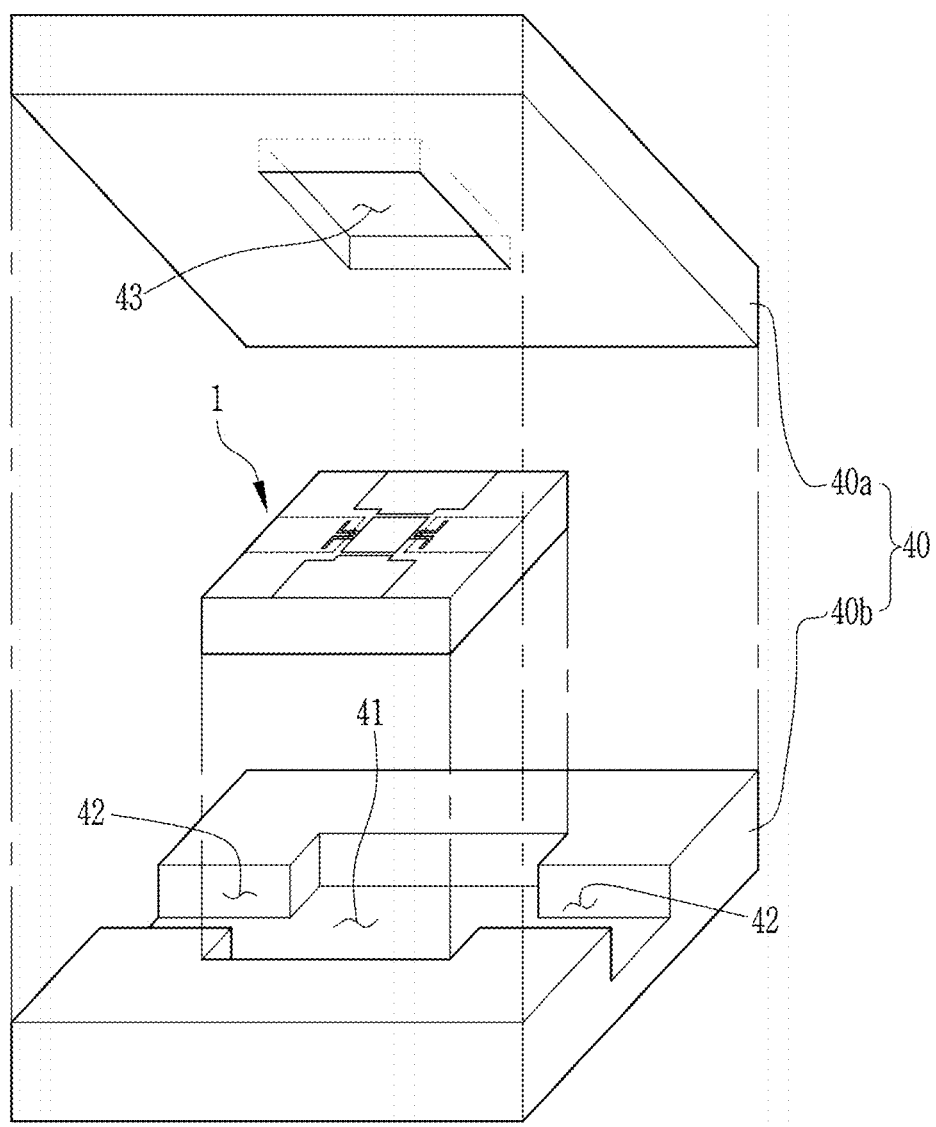
FIG. 6 is an exploded perspective view of a package housing according to an exemplary embodiment of the present invention.
Figure 7:
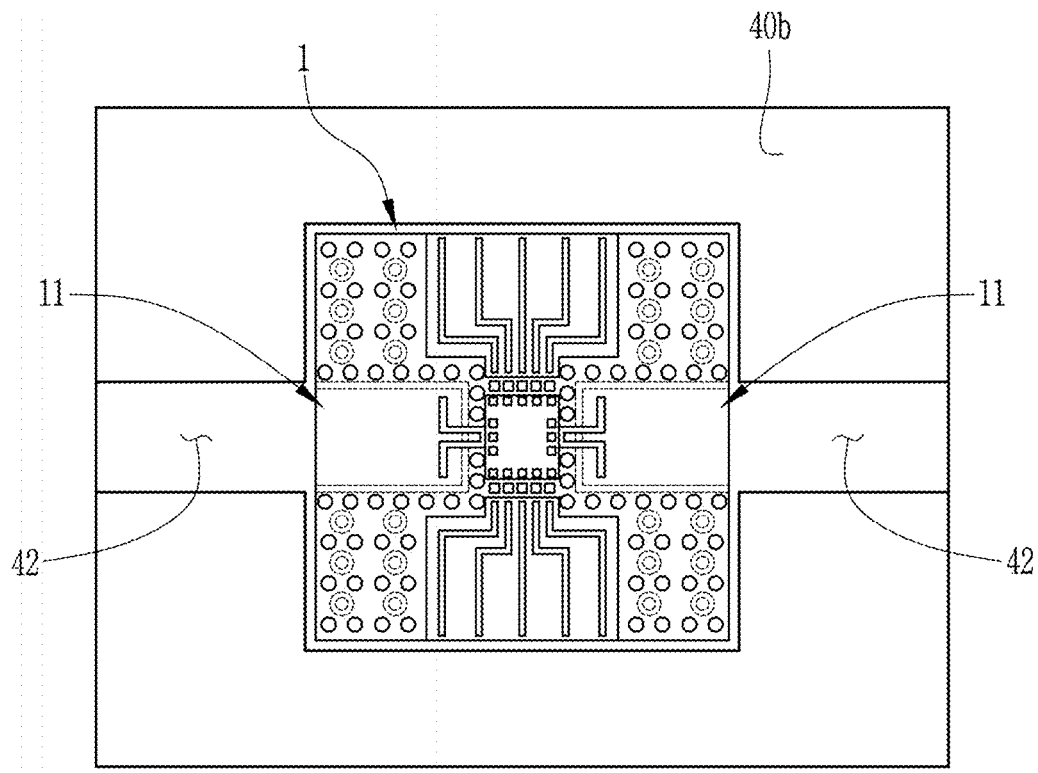
FIG. 7 is a plan view showing a state in which a waveguide package is inserted into the package housing according to the exemplary embodiment of the present invention.
Figure 8:
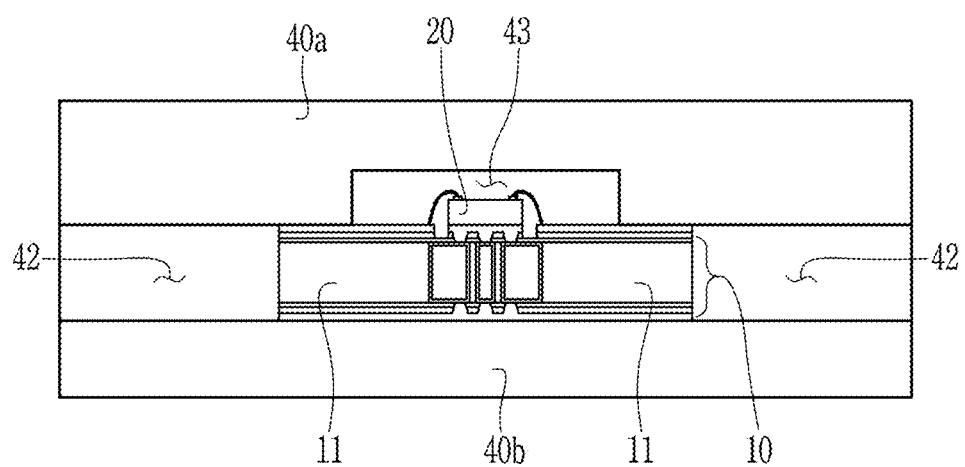
FIG. 8 is a cross-sectional view taken along line D-D' in FIG. 7.

FIG. 6 is an exploded perspective view of a package housing 40 according to an exemplary embodiment of the present invention. FIG. 7 is a plan view showing a state in which a waveguide package 1 is inserted into the package housing 40 according to the exemplary embodiment of the present invention. FIG. 8 is a cross-sectional view taken along line D-D' in FIG. 7.

The package housing 40 may accommodate the waveguide package 1 therein. The package housing 40 may include a waveguide extension portion 42 connected to a waveguide 11 of the waveguide package 1, to transmit an electrical signal.

The package housing 40 may be formed through coupling of an upper housing 40a and a lower housing 40b. The package housing 40 may include the lower housing 40b, which includes a package receiving portion 41 formed at one surface of the lower housing 40b and configured to receive the waveguide package 1, and the waveguide extension portion 42 extending from the package receiving portion 41 while being connected to the waveguide 11, and the upper housing 40a, which includes a cap portion 43 formed at one surface of the upper housing 40a and configured to receive a semiconductor chip 20. The upper housing 40a is coupled to the lower housing 40b such that the cap portion 43 faces the package receiving portion 41. In this case, the upper housing 40a and the lower housing 40b may be formed of an electrically conductive material such as a metal, etc.

The package receiving portion 41 is a space formed at one surface of the lower housing 40b. The package receiving portion 41 is formed to have a shape corresponding to the shape of the waveguide package 1. The package receiving portion 41 may be formed at a central portion of the lower housing 40b. The package receiving portion 41 may be formed to have a depth corresponding to the height of the waveguide package 1.

The waveguide extension portion 42 is a space formed at one surface of the lower housing 40b. The waveguide extension portion 42 may be formed to be connected to the package receiving portion 41. The waveguide 11 of the waveguide package 1 and the waveguide extension portion 42 of the lower housing 40b may be formed such that cross-sections thereof are identical. Although the height of the waveguide extension portion 42 and the height of the waveguide 11 are shown in FIG. 8 as being different from each other, it may be understood that, since thicknesses of an inner metal layer 130, an upper insulating layer 141, a lower insulating layer 142, a lower metal layer, and an upper metal layer of the waveguide 11 are very small, the cross-section of the waveguide extension portion 42 and the cross-section of the waveguide 11 are formed to be substantially identical.

The cap portion 43 is a space formed at one surface of the upper housing 40a. The cap portion 43 may accommodate a semiconductor chip 20 of the waveguide package 1 therein. The upper housing 40a and the lower housing 40b may be coupled to each other such that the waveguide package 1 is mounted in the package receiving portion 41 of the lower housing 40b, and the cap portion 43 of the upper housing 40a covers the semiconductor chip 20.

When the package housing 40 is used, the lower insulating layer 142 and the lower metal layer, that is, a first lower metal layer 152 and a second lower metal layer 172, may not be formed at the waveguide package 1. The waveguide 11 may be formed by a first surface 130a, a second surface 130b, and a third surface 130c of the inner metal layer 130 of the waveguide package 1, the upper metal layer of the waveguide package 1, and an inner surface of the package receiving portion 41 of the lower housing 40b. Such formation of the waveguide 11 is possible because the inner metal layer 130 contacts the inner surface of the package receiving portion 41 of the lower housing 40band, as such, the package receiving portion 41 of the lower housing 40b may function as a part of the waveguide 11. When formation of the lower insulating layer 142, the first lower metal layer 152, and the second lower metal layer 172 is omitted, process simplification and a reduction in manufacturing cost may be achieved.

Figure 9:
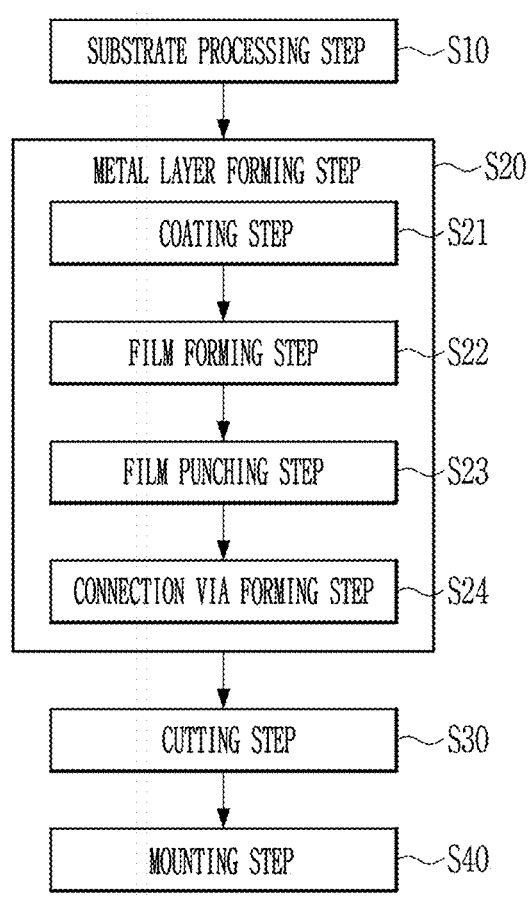
FIG. 9 is a flowchart showing steps of a method of manufacturing a waveguide package in accordance with an exemplary embodiment of the present invention.

FIG. 9 is a flowchart showing steps of a method of manufacturing a waveguide package in accordance with an exemplary embodiment of the present invention.

The waveguide package manufacturing method according to the exemplary embodiment of the present invention may include a substrate processing step S10 of forming a cavity 110 extending through one surface and the other surface of a substrate 100 while having a center at a package boundary G, a metal layer forming step S20 of forming an inner metal layer 130 at an inner surface of the cavity 110, and forming, at the one surface and the other surface of the substrate 100, metal layers connected to the inner metal layer 130 while covering one surface and the other surface of the cavity 110, respectively, a cutting step S30 of cutting the resultant structure along the package boundary G, thereby forming a package structure 10 including a waveguide 11 opened to one side surface of the substrate 100, and a mounting step S40 of mounting a semiconductor chip 20 on the one surface of the substrate 100.

The substrate processing step S10 is a procedure for forming the cavity 110, a substrate through hole 120h, and other required structures by processing the substrate 100 which is formed of photosensitive glass. The substrate processing step S10 includes exposure, heating, and etching procedures. First, a mask is formed at the photoresist glass substrate 100. The mask exposes a region where the cavity 110 will be formed and a region where the substrate through hole 120h will be formed. Exposure is performed by irradiating the regions exposed by the mask with ultraviolet light or the like. The photosensitive glass exposed to ultraviolet light is changed in internal structure. After removal of the mask, the photosensitive glass substrate 100 is heated. When the substrate 100 is heated, exposed portions thereof are crystallized. Thereafter, the substrate 100 is etched using an acidic solution such as hydrogen fluoride (HF). The crystallized portions of the substrate 100 exhibit a higher etch rate than a non-crystallized portion of the substrate 100 by 40 to 50 times. Accordingly, it may be possible to remove only the crystallized portions in a state in which the non-crystallized portion is hardly damaged. When the substrate processing step S10 is performed, the cavity 110 and the substrate through hole 120h may be formed at the substrate 100.

The metal layer forming step S20 may include a coating step S21 of forming an inner metal layer 130 at a surface of the substrate 100, a film forming step S22 of performing lamination coating at the one surface of the substrate 100 using a film including an upper insulating layer 141 and a first upper metal layer 151, to cover the inner metal layer 130 and the cavity 110, and performing lamination coating at the other surface of the substrate 100 using a film including a lower insulating layer 142 and a first lower metal layer 152, to cover the inner metal layer 130 and the cavity 110, a film punching step S23 of forming, along a circumference of the cavity 110, a plurality of upper through holes 161h extending through the upper insulating layer 141 and the first upper metal layer 151, thereby exposing the inner metal layer 130 formed at the one surface of the substrate 100, and forming, along the circumference of the cavity 110, a plurality of lower through holes 162h extending through the lower insulating layer 142 and the first lower metal layer 152, thereby exposing the inner metal layer 130 formed at the other surface of the substrate 100, and a connection via forming step S24 of forming a second upper metal layer 171 on the first upper metal layer 151, thereby forming an upper connection via 161 interconnecting the inner metal layer 130, the first upper metal layer 151, and the second upper metal layer 171 via each of the upper through holes 161h, and forming a second lower metal layer 172 on the first lower metal layer 152, thereby forming a lower connection via 162 interconnecting the inner metal layer 130, the first lower metal layer 152, and the second lower metal layer 172 via each of the lower through holes 162*h*.

The metal layer forming step S20 is a procedure for forming a metal layer at the substrate 100, thereby forming the waveguide 11. The coating step S21 is a procedure for forming the inner metal layer 130 at the surface of the substrate 100 formed of photosensitive glass. The film forming step S22 is a procedure for coupling films formed of an insulating layer and a metal layer to the one surface and the other surface of the substrate 100, respectively. The film punching step S23 is a procedure for forming, along the circumference of the cavity 110, through holes extending through the films, thereby exposing the inner metal layer 130. The connection via forming step S24 is a procedure for additionally forming a metal layer on the films, thereby interconnecting the upper metal layer and the inner metal layer 130 and interconnecting the lower metal layer and the inner metal layer 130. As the metal layer forming step S20 is performed, the metal layers formed at the inner surface of the cavity 110 and the one surface and the other surface of the cavity 110 are interconnected and, as such, the waveguide 11 may be formed.

The cutting step S30 is a procedure for cutting the large substrate 100 formed with package structures 10 along boundaries G of the package structures 10. As the cutting step S30 is performed, each package structure 10 may be separated. Each separated package structure 10 is in a state in which a structure of the cavity 110 opened at one side surface thereof is formed.

The mounting step S40 is a procedure for mounting the semiconductor chip 20 on the package structure 10, and interconnecting a chip pad 21 of the semiconductor chip 20 and the waveguide 11 by a wire 30 through wire bonding. The mounting step S40 may be performed before the cutting step S30.

Hereinafter, the waveguide package manufacturing method according to the exemplary embodiment of the present invention will be described in detail with reference to FIGS. 10, 11, 12, and 13.

Figure 10:
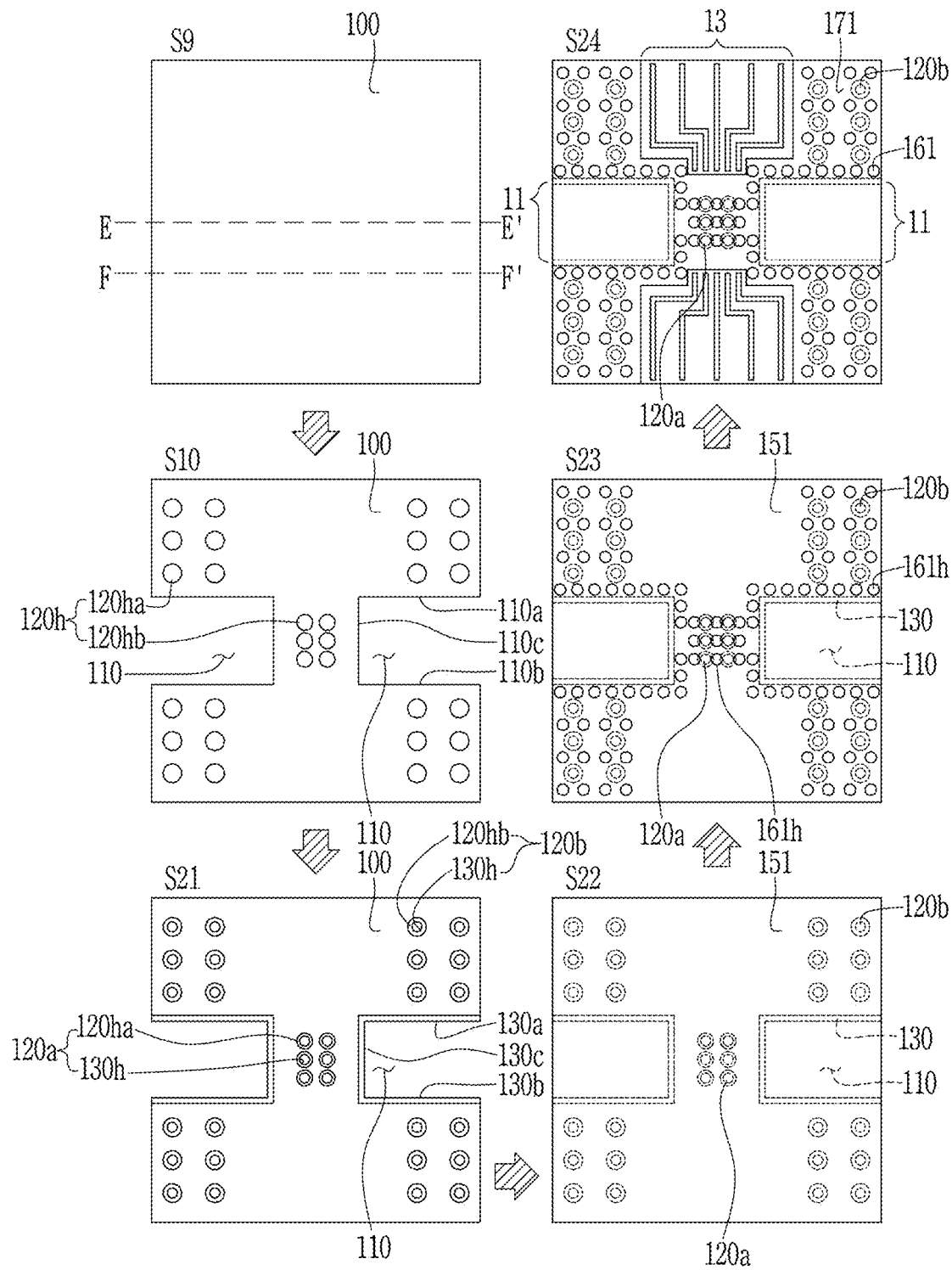
FIG. 10 is a plan view showing a procedure for manufacturing a package structure in the waveguide package manufacturing method according to the exemplary embodiment of the present invention.
Figure 11:
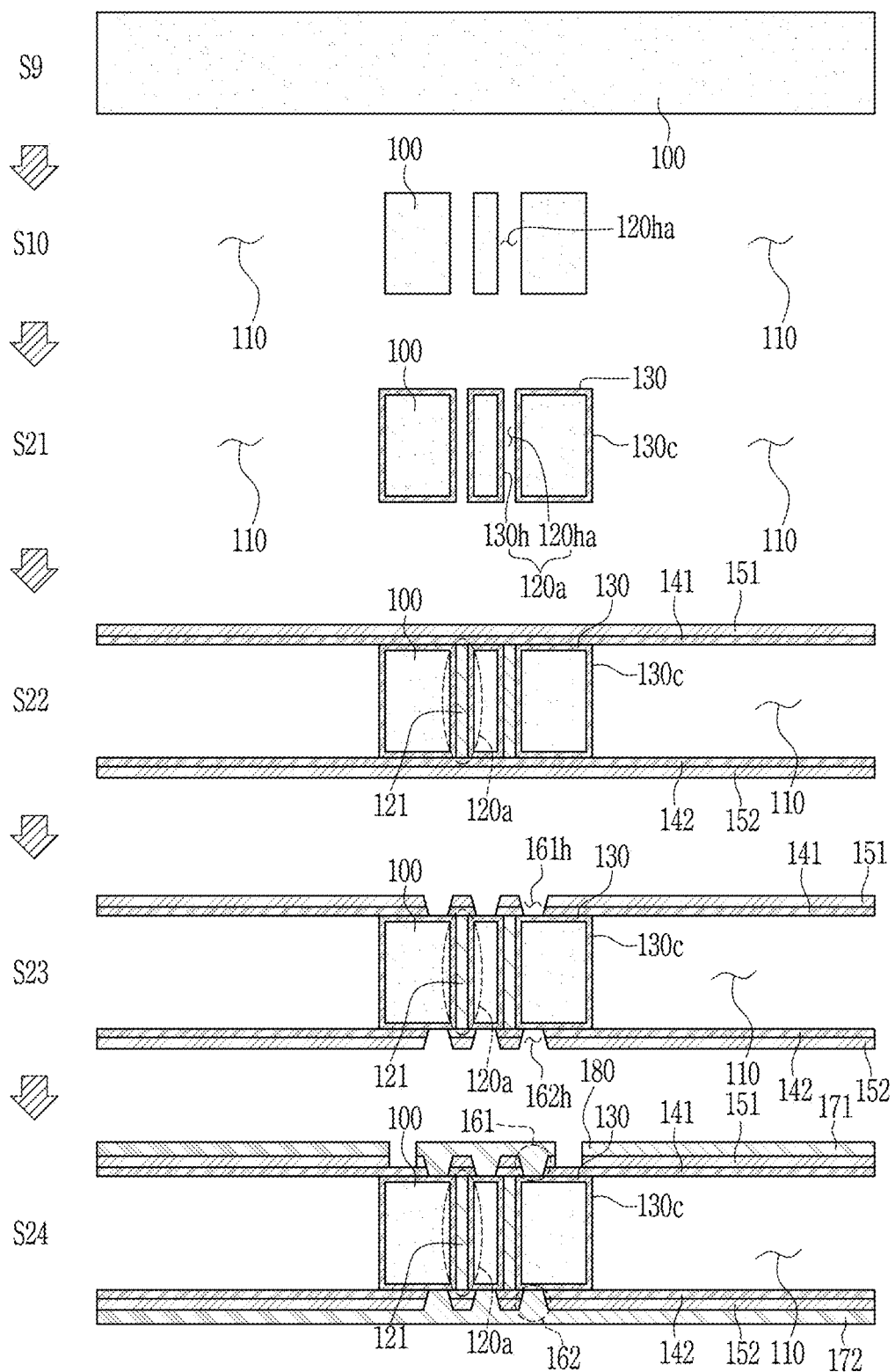
FIG. 11 is a cross-sectional view taken along line E-E' in FIG. 10.
Figure 12:
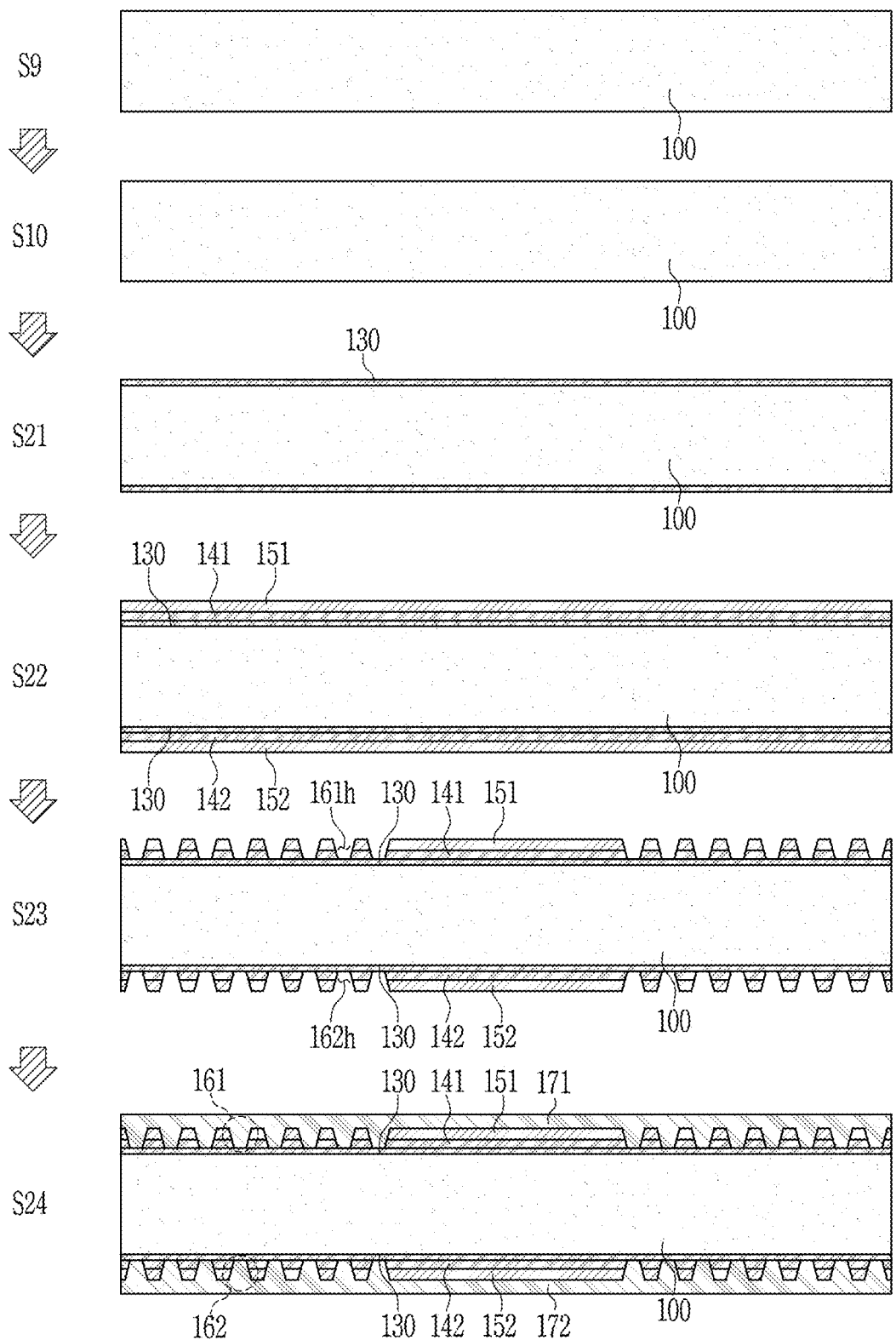
FIG. 12 is a cross-sectional view taken along line F-F' in FIG. 10.
Figure 13:
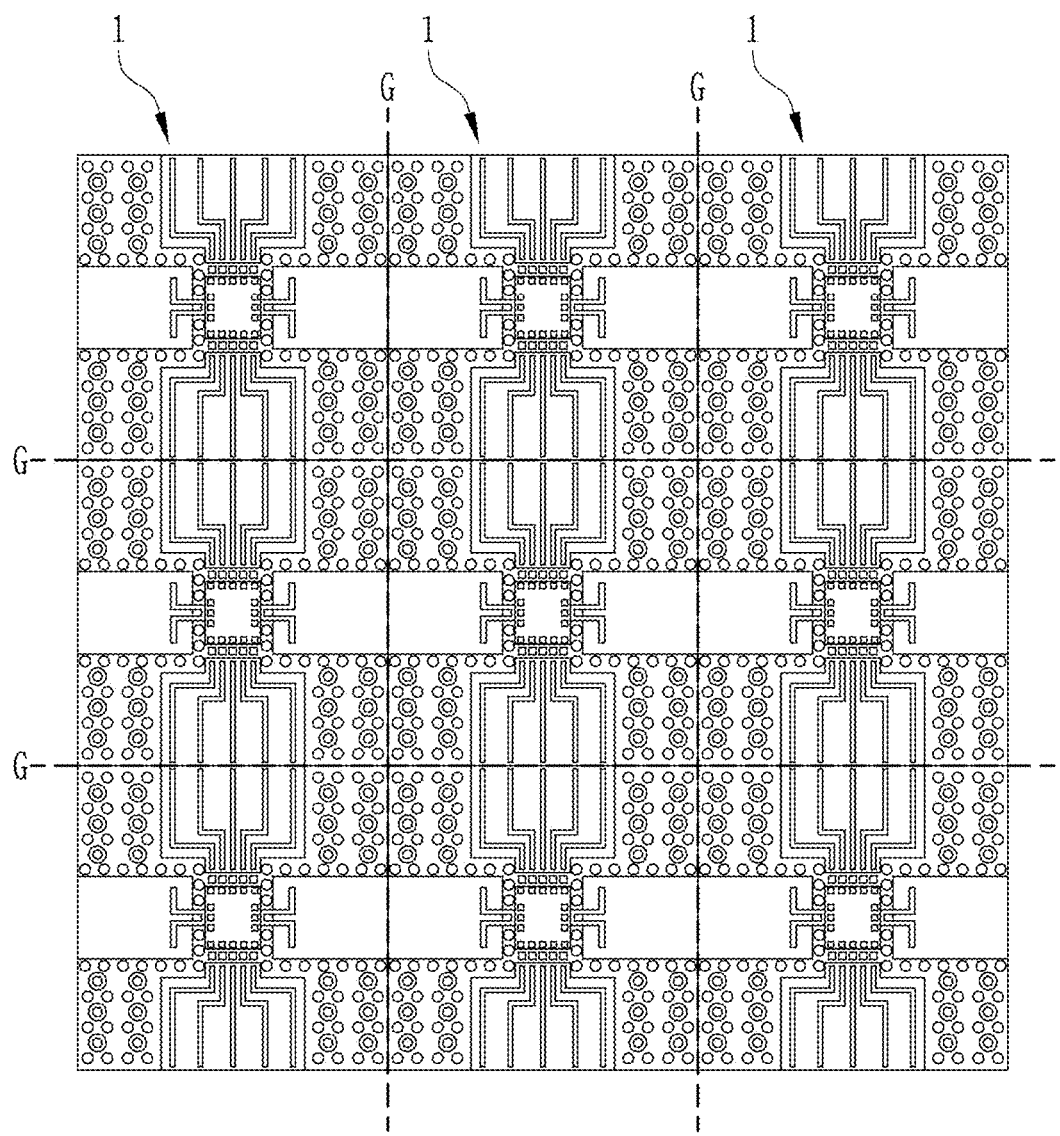
FIG. 13 is a view explaining a cutting step of the waveguide package manufacturing method according to the exemplary embodiment of the present invention.

FIG. 10 is a plan view showing a procedure for manufacturing a package structure in the waveguide package manufacturing method according to the exemplary embodiment of the present invention. FIG. 11 is a cross-sectional view taken along line E-E' in FIG. 10. FIG. 12 is a cross-sectional view taken along line F-F' in FIG. 10. FIG. 13 is a view explaining the cutting step of the waveguide package manufacturing method according to the exemplary embodiment of the present invention. In FIG. 10, the lines E-E' and F-F' are shown only in association with S9. However, it may be understood that the lines E-E' and F-F' are disposed in association with S10, S21, S22, S23, and S24, similarly to S9. The line E-E' is disposed at the same position as that of the line A-A' in FIG. 1, and the line F-F' is disposed at the same position as that of the line B-B' in FIG. 1.

Although FIGS. 10, 11, and 12 show respective steps of the waveguide package manufacturing method with reference to a substrate 100 having a size forming one package structure 10, it may be understood that the waveguide package manufacturing method may also be applied to one large substrate 100, as shown in FIG. 13.

Referring to S9 of FIGS. 10, 11, and 12, a substrate 100 made of photosensitive glass is first prepared before execution of the substrate processing step S10. The substrate 100 made of photosensitive glass may take the form of a plate having one surface, and the other surface opposite to the one surface.

Referring to S10 of FIGS. 10, 11, and 12, the substrate processing step S10 may form a cavity 110 at the substrate 100. The substrate processing step S10 may further form a substrate through hole 120*h* extending through the one surface and the other surface of the substrate 100. S10 of FIG. 12, which is a cross-sectional view taken along line F-F' in FIG. 10, is shown to be identical to S9 because the cavity 110 and the substrate through hole 120*h* are not formed in a region corresponding to line F-F'.

The center of the cavity 110 may be disposed at a package boundary G shown in FIG. 13. The cavity 110 may be symmetrically formed with respect to the package boundary G. Two cavities 110 may be formed at opposite sides of a region where a semiconductor chip 20 will be mounted, respectively. The cavity 110 may be formed to have a "Y" shape in order to form a coupler or a distributor. The center of the cavity 110 may not be disposed at the package boundary G. A slot antenna may be formed by forming the cavity 110 such that the cavity 110 does not overlap with the package boundary G, and then further forming a slot.

The substrate through hole 120*h* may be formed in plural in a region where the semiconductor chip 20 will be mounted. A first substrate through hole 120*ha* formed in the region where the semiconductor chip 20 is formed, to form a first through glass via 120*a*. The substrate through hole 120*h* may be formed in plural near a corner where two side surfaces of the substrate 100 meet. A second substrate through hole 120*hb* formed near the corner of the substrate 100 is formed to form a second through glass via 120*b*. The cavity 110 is formed at opposite portions of the substrate 100 in a horizontal direction, and opposite portions of the substrate 100 in a vertical direction are regions where an electronic circuit 13 is formed. A central portion of the substrate 100 may be a region where the semiconductor chip 20 will be mounted. The substrate through hole 120*h* may not be formed in the region where the cavity 110 is formed or the region where the electronic circuit 13 is formed.

Referring to S21 of FIGS. 10, 11, and 12, the coating step S21 of the metal layer forming step S20 is a procedure for forming the inner metal layer 130 at the substrate 100. In the coating step S21, the inner metal layer 130 may be formed on the first inner surface 110*a*, the second inner surface 110*b*, and the third inner surface 110*c* of the cavity 110. The inner metal layer 130 may be formed at the one surface and the other surface of the substrate 100. That is, the coating step S21 may form the inner metal layer 130 at the one surface and the other surface of the substrate 100, the inner surface of the cavity 110, and the inner surface of the substrate through hole 120*h*. The inner metal layer 130 may be formed at the inner surface of the inner through hole 120*h*. The substrate through hole 120*h* formed in the region where the semiconductor chip 20 will be mounted and a hole portion 130*h* of the inner metal layer 130 formed at the inner surface of the substrate through hole 120*h* may form the first through glass via 120*a*. The substrate through hole 120*h* formed at the corner of the substrate 100 and a hole part 130*h* of the inner metal layer 130 formed at the inner surface of the substrate through hole 120*h* may form the second through glass via 120*b*. If necessary, the through glass via 120 may be formed as a path transferring an electrical signal by removing a portion of the inner metal layer 130 such that the inner metal layer 130 surrounds the first through glass via 120*a* or the second through glass via 120*b*. An electrically insulating filler 121 may fill an interior of the hole part 130*h* of the inner metal layer 130. The hole part 130*h* of the inner metal layer 130 may be formed to fill an interior of the substrate through hole 120*h* without formation of the filler 121.

S22 of FIGS. 10, 11, and 12 will be referred to. In FIG. 10, the first upper metal layer 151 is viewed, and the first through glass via 120*a*, the second through glass via 120*b*, the cavity 110, and the inner metal layer 130 hidden by the first upper metal layer 151 are indicated by a dotted line. The film forming step S22 of the metal layer forming step S20 is a procedure for lamination-coating a film formed of an insulating layer and a metal layer at the one surface and the other surface of the substrate 100. The film may be coupled such that the insulating layer thereof faces the inner metal layer 130 formed at the substrate 100. The film coupled to the side of the one surface of the substrate 100 becomes the upper insulating layer 141 and the first upper metal layer 151. The film coupled to the side of the other surface of the substrate 100 becomes the lower insulating layer 142 and the first lower metal layer 152.

In the film forming step S22, a method, in which the upper insulating layer 141 and the lower insulating layer 142 are first formed on the substrate 100, and the first upper metal layer 151 and the first lower metal layer 152 are then formed, may be used. Of course, since the cavity 110 is an empty space, it may be difficult to separately form only the insulating layer. In addition, it may be difficult to first form the insulating layer, and then to form the metal layer on the insulating layer. The exemplary embodiment of the present invention exhibits a low failure rate because the insulating layer and the metal layer are coupled to the substrate 100 in a state in which the insulating layer and the metal layer are previously formed into a film.

S23 of FIGS. 10, 11, and 12 will be referred to. In FIG. 10, the first upper metal layer 151 and the upper through hole 161*h* are shown to be viewed, and the first through glass via 120*a*, the second through glass via 120*b*, the cavity 110, and the inner metal layer 130 hidden by the first upper metal layer 151 are indicated by a dotted line. The film punching step S23 of the metal layer forming step S20 is a procedure for forming a through hole extending through the films along the circumference of the cavity 110 formed at the substrate 100. The upper through hole 161*h* extending through the upper insulating layer 141 and the first upper metal layer 151 is formed in plural along the circumference of the cavity 110. The lower through hole 162*h* extending through the lower insulating layer 142 and the first lower metal layer 152 is formed in plural along the circumference of the cavity 110. Preferably, the upper through hole 161*h* and the lower through hole 162*h* are formed to be nearest to the circumference of the cavity 110. Preferably, the upper through hole 161*h* and the lower through hole 162*h* are formed to be adjacent to ends of the first surface 130*a*, the second surface 130*b*, and the third surface 130*c* of the inner metal layer 130 formed at the inner surface of the cavity 110.

Even in the region where the semiconductor chip 20 will be mounted, the upper through hole 161*h* and the lower through hole 162*h* may be densely formed. The upper through hole 161*h* and the lower through hole 162*h* formed in the region where the semiconductor chip 20 will be mounted may form the upper connection via 161 and the lower connection via 161, respectively, and may perform a function for dissipating heat generated by the semiconductor chip 20.

S24 of FIGS. 10, 11, and 12 will be referred to. In FIG. 10, the second upper metal layer 171 is viewed, and the first through glass via 120*a*, the second through glass via 120*b*, the cavity 110, and the inner metal layer 130 hidden by the second upper metal layer 171 are indicated by a dotted line. The connection via forming step S24 of the metal layer forming step S20 is a procedure for interconnecting the inner metal layer 130 and the upper metal layer, which are in a state of being insulated from each other by the insulating layer, and interconnecting the inner metal layer 130 and the lower metal layer, which are in a state of being insulated from each other by the insulating layer. The connection via forming step S24 forms the second upper metal layer 171 on the first upper metal layer 151. A portion of the second upper metal layer 171 is connected to the inner metal layer 130 via the upper through hole 161*h*, thereby forming the upper connection via 161. The connection via forming step S24 forms the second lower metal layer 172 on the first lower metal layer 152. A portion of the second lower metal layer 172 is connected to the inner metal layer 130 via the lower through hole 162*h*, thereby forming the lower connection via 162. Since the inner metal layer 130, the upper metal layer, and the lower metal layer are interconnected via the upper connection via 161 and the lower connection via 162, the waveguide 11 may be formed at the cavity 110.

The connection via forming step S24 may further form the electronic circuit 13 by patterning the first upper metal layer 151 and the second upper metal layer 171. In the connection via forming step S24, the electronic circuit 13 may further be formed by first forming the second upper metal layer 171 and the second lower metal layer 172, and then patterning the second upper metal layer 171 and the second lower metal layer 172. When the first upper metal layer 151 and the second upper metal layer 171 are patterned to remove portions thereof, a transmission line or an electrode pattern may be formed. Since the upper insulating layer 141 insulates and supports the first upper metal layer 151 and the second upper metal layer 171, the electronic circuit 13 may be formed on the upper insulating layer 141. The electronic circuit 13 may be connected to the other surface of the package structure 10 via the through glass via 120. The electronic circuit 13 may also be formed by patterning the first lower metal layer 152 and the second lower metal layer 172. Since the lower insulating layer 142 insulates and supports the first lower metal layer 152 and the second lower metal layer 172, the electronic circuit 13 may be formed on the lower insulating layer 142. For formation of the electronic circuit 13, a process for mounting a capacitor, a resistor, an inductor, and other elements, and other processes may be further performed through thin film deposition.

The connection via forming step S24 may further form a signal transition member 180 by patterning the first upper insulating layer 141, the first upper metal layer 151, and the second upper metal layer 171 on the cavity 110.

The signal transition member 180 may be formed simultaneously with the electronic circuit 13 in the patterning process for formation of the electronic circuit 13. The signal transition member 180 may be formed through a method in which the first upper metal layer 151 and the second upper metal layer 171 are patterned to remove portions thereof.

The cutting step S30 will be described with reference to FIG. 13. The cutting step S30 is a procedure for cutting one large substrate 100 along package boundaries G, thereby separating the large substrate 100 into a plurality of package structures 10 in the case in which the plurality of package structures 10 is formed at once using the large substrate 100. When the substrate 100 is cut along the package boundaries G, cavities 110 opened to side surfaces of the substrate 100 may be formed because centers of the cavities 110 are disposed at the package boundaries G. That is, a waveguide 11 opened to one side surface of each package structure 10 may be formed. Although each package structure 10 may be individually formed, it is advantageous to form a plurality of package structures 10 at one large substrate 100 at once. The cutting step S30 may be performed along lattice-shaped package boundaries G using a laser process, a dicing process, etc. The cutting step S30 may be performed after execution of the mounting step S40.

The mounting step S40 is a procedure for disposing the semiconductor chip 20 to be adjacent to the cavity 110, and then interconnecting the signal transition member 180 and the chip pad 21 of the semiconductor chip 20 by a wire through wire bonding. In the mounting step S40, the semiconductor chip 20 may be mounted such that an inactive surface thereof faces one surface of the package structure 10. The inactive surface of the semiconductor chip 20 may dissipate heat through the upper connection via 161, the first through via, and the lower connection via 162 formed in the region where the semiconductor chip 20 is mounted. The chip pad 21 at an active surface of the semiconductor chip 20 may be connected to the signal transition member 180 by the wire 30 through wire bonding.

In accordance with the waveguide package 1 and the method of manufacturing the same according to the exemplary embodiments of the present invention, the waveguide 11 with air therein is provided and, as such, electrical loss of the waveguide 11 may be minimized. In addition, the cavity 110 is formed by processing the substrate 100 made of photosensitive glass and, as such, the waveguide 11 may be formed to have an accurate size. In addition, the electronic circuit 13 may also be formed at the waveguide package 1. Accordingly, the degree of integration of the waveguide package 1 may be enhanced. In addition, a structure in which a metal layer is supported by an insulating layer is provided and, as such, a DC circuit, an RF circuit, an RF transmission line, etc. may be formed at the waveguide package 1 by patterning the metal layer on the insulating layer. Furthermore, an input/output pad may be formed at a back surface of the waveguide package 1 using the through glass via 120, and parts may be integrated at the back surface of the waveguide package 1.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

Simple modifications and alterations fall within the scope of the invention, and the protection scope of the invention will be apparent from the appended claims.

What is claimed is:

1. A waveguide package comprising:
   a package structure comprising a waveguide opened toward one side surface of a substrate; and
   a semiconductor chip mounted on one surface of the package structure and configured to output an electrical signal to the waveguide,
   wherein the waveguide comprises a cavity extending through the one surface of the substrate and another surface of the substrate opposite to the one surface.

2. The waveguide package according to claim 1, wherein the waveguide further comprises:
   an inner metal layer formed at an inner surface of the cavity;
   an upper metal layer formed at the one surface of the substrate, to cover a side of one surface of the cavity; and
   a lower metal layer formed at the other surface of the substrate, to cover a side of another surface of the cavity,
   wherein the cavity is opened to the one side surface of the substrate.

3. The waveguide package according to claim 1, wherein the waveguide further comprises:
   an inner metal layer formed at an inner surface of the cavity;
   an upper metal layer formed at the one surface of the substrate, to cover a side of one surface of the cavity;
   a lower metal layer formed at the other surface of the substrate, to cover a side of another surface of the cavity;
   an upper insulating layer formed between the inner metal layer and the upper metal layer, to support the upper metal layer;
   a lower insulating layer formed between the inner metal layer and the lower metal layer, to support the lower metal layer;
   an upper connection via formed to extend through the upper insulating layer and the upper metal layer and configured to interconnect the upper metal layer and the inner metal layer; and
   a lower connection via formed to extend through the lower insulating layer and the lower metal layer and configured to interconnect the lower metal layer and the inner metal layer,
   wherein the upper connection via and the lower connection via are formed in plural, the plurality of upper connection vias are disposed along a circumference of the cavity to be spaced apart from one another by a predetermined distance, and the plurality of lower connection vias are disposed along the circumference of the cavity to be spaced apart from one another by a predetermined distance, and
   wherein the cavity is opened to the one side surface of the substrate.

4. The waveguide package according to claim 1, wherein the waveguide further comprises:
   an inner metal layer formed at an inner surface of the cavity;
   a first upper metal layer formed at the one surface of the substrate, to cover a side of one surface of the cavity;
   a first lower metal layer formed at the other surface of the substrate, to cover a side of another surface of the cavity;
   an upper insulating layer formed between the inner metal layer and the first upper metal layer, to support the first upper metal layer;
   a lower insulating layer formed between the inner metal layer and the first lower metal layer, to support the first lower metal layer;
   a plurality of upper through holes formed to extend through the upper insulating layer and the first upper metal layer and to be spaced apart from one another by a predetermined distance along a circumference of the cavity;
   a plurality of lower through holes formed to extend through the lower insulating layer and the first lower metal layer and to be spaced apart from one another by a predetermined distance along the circumference of the cavity;
   a second upper metal layer formed at the first upper metal layer, to be connected to the inner metal layer via the upper through holes; and a second lower metal layer formed at the first lower metal layer, to be connected to the inner metal layer via the lower through holes, wherein the cavity is opened to the one side surface of the substrate.

5. The waveguide package according to claim 1, wherein the package structure further comprises a through glass via extending through the one surface and another surface of the substrate, to provide an electrical ground or to dissipate heat generated from the semiconductor chip.

6. The waveguide package according to claim 1, wherein the package structure further comprises an electronic circuit formed at the one surface of the substrate and connected to the semiconductor chip.

7. The waveguide package according to claim 6, wherein the cavity has a "Y"-shape, so as to function as a distributor or a coupler, or comprises a slot without being opened to one side surface of the substrate, so as to function as a slot antenna.

8. A package housing comprising:
a lower housing comprising a package receiving portion formed at one surface of the lower housing and configured to receive the waveguide package of claim 1, and a waveguide extension portion extending from the package receiving portion while being connected to the waveguide of claim 1; and
an upper housing comprising a cap portion formed at one surface of the upper housing and configured to receive the semiconductor chip of claim 1, the upper housing being coupled to the lower housing such that the cap portion faces the package receiving portion,
wherein the upper housing and the lower housing are formed of an electrically conductive material.

9. A method of manufacturing a waveguide package, the method comprising:
a substrate processing step of forming a cavity extending through one surface and another surface of a substrate while having a center at a package boundary;
a metal layer forming step of forming an inner metal layer at an inner surface of the cavity, and forming, at the one surface and the other surface of the substrate, metal layers connected to the inner metal layer while covering one surface and another surface of the cavity, respectively;
a cutting step of cutting a resultant structure along the package boundary, thereby forming a package structure including a waveguide opened to one side surface of the substrate; and
a mounting step of mounting a semiconductor chip on the one surface of the substrate.

10. The method according to claim 9, wherein the metal layer forming step comprises:

a coating step of forming an inner metal layer at a surface of the substrate;
a film forming step of performing lamination coating at the one surface of the substrate using a film comprising an upper insulating layer and a first upper metal layer, to cover the inner metal layer and the cavity, and performing lamination coating at the other surface of the substrate using a film comprising a lower insulating layer and a first lower metal layer, to cover the inner metal layer and the cavity;
a film punching step of forming, along a circumference of the cavity, a plurality of upper through holes extending through the upper insulating layer and the first upper metal layer, thereby exposing the inner metal layer formed at the one surface of the substrate, and forming, along the circumference of the cavity, a plurality of lower through holes extending through the lower insulating layer and the first lower metal layer, thereby exposing the inner metal layer formed at the other surface of the substrate; and
a connection via forming step of forming a second upper metal layer on the first upper metal layer, thereby forming an upper connection via interconnecting the inner metal layer, the first upper metal layer, and the second upper metal layer via each of the upper through holes, and forming a second lower metal layer on the first lower metal layer, thereby forming a lower connection via interconnecting the inner metal layer, the first lower metal layer, and the second lower metal layer via each of the lower through holes.

11. The method according to claim 10, wherein:
the substrate processing step further forms a substrate through hole extending through the one surface and the other surface of the substrate; and
the coating step forms the inner metal layer at the one surface and the other surface of the substrate, the inner surface of the cavity, and an inner surface of the substrate through hole.

12. The method according to claim 10, wherein the connection via forming step further forms an electronic circuit by patterning the first upper metal layer and the second upper metal layer.

13. The method according to claim 10, wherein:
the connection via forming step further forms a signal transition member by patterning the first upper insulating layer, the first upper metal layer, and the second upper metal layer on the cavity; and
the mounting step disposes the semiconductor chip to be adjacent to the cavity, and then interconnects the signal transition member and a chip pad of the semiconductor chip through wire bonding.

* * * * *